(12) United States Patent
Chan et al.

(10) Patent No.: US 7,873,119 B2
(45) Date of Patent: Jan. 18, 2011

(54) INPUT DRIVE CONTROL FOR SWITCHER REGULATED POWER AMPLIFIER MODULES

(75) Inventors: Wen-Yen Chan, Waterloo (CA); Nasserullah Khan, Waterloo (CA)

(73) Assignee: Research In Motion Limited, Waterloo, Ontario (CA)

(*) Notice: Subject to any disclaimer, the term of this patent is extended or adjusted under 35 U.S.C. 154(b) by 798 days.

(21) Appl. No.: 11/763,099

(22) Filed: Jun. 14, 2007

(65) Prior Publication Data

US 2007/0291872 A1 Dec. 20, 2007

Related U.S. Application Data

(60) Provisional application No. 60/813,340, filed on Jun. 14, 2006.

(51) Int. Cl.
*H04L 25/03* (2006.01)
(52) U.S. Cl. ............... 375/297; 375/130; 375/295; 375/296
(58) Field of Classification Search ............... 375/297, 375/130, 295, 296; 455/127.1, 234.1, 324, 455/522; 370/338
See application file for complete search history.

(56) References Cited

U.S. PATENT DOCUMENTS

| | | | |
|---|---|---|---|
| 3,486,128 A | 12/1969 | Lohrmann |
| 4,453,264 A | 6/1984 | Hochstein |
| 4,809,339 A | 2/1989 | Shih et al. |
| 4,849,711 A | 7/1989 | Leis et al. |
| 5,267,262 A | 11/1993 | Wheatley, III |
| 5,452,473 A | 9/1995 | Weiland et al. |
| 5,467,058 A | 11/1995 | Fujita |
| 5,485,486 A | 1/1996 | Gilhousen et al. |
| 5,732,334 A | 3/1998 | Miyake |
| 6,043,707 A | 3/2000 | Budnik |
| 6,064,269 A | 5/2000 | Ruppel et al. |
| 6,107,878 A | 8/2000 | Black |

(Continued)

FOREIGN PATENT DOCUMENTS

CN 1329413 1/2002

(Continued)

OTHER PUBLICATIONS

International Preliminary Search Report on Patentability dated Dec. 31, 2008, International Patent Application No. PCT/CA2007/001055.

(Continued)

*Primary Examiner*—Shuwang Liu
*Assistant Examiner*—Dhaval Patel
(74) *Attorney, Agent, or Firm*—Bereskin & Parr LLP/S.E.N.C.R.L., S.r.l.

(57) ABSTRACT

Various embodiments described herein relate to a power management block and an amplification block used in the transmitter of a communication subsystem. The power management block provides improved control for the gain control signal provided to a pre-amplifier and the supply voltage provided to a power amplifier which are both in the amplification block. The power expended by the power amplifier is optimized by employing a continuous control method in which one or more feedback loops are employed to take into account various characteristics of the transmitter components and control values.

21 Claims, 6 Drawing Sheets

U.S. PATENT DOCUMENTS

| | | | |
|---|---|---|---|
| 6,137,840 | A | 10/2000 | Tiedemann, Jr. et al. |
| 6,166,598 | A | 12/2000 | Schlueter |
| 6,178,313 | B1 | 1/2001 | Mages et al. |
| 6,205,127 | B1 | 3/2001 | Ramesh |
| 6,208,202 | B1 | 3/2001 | Kaufman et al. |
| 6,265,935 | B1 | 7/2001 | Kaneda et al. |
| 6,313,698 | B1 | 11/2001 | Zhang et al. |
| 6,359,504 | B1 | 3/2002 | Cozzarelli |
| 6,373,823 | B1 | 4/2002 | Chen et al. |
| 6,421,327 | B1 | 7/2002 | Lundby et al. |
| 6,445,247 | B1 | 9/2002 | Walker |
| 6,525,605 | B2 | 2/2003 | Hu et al. |
| 6,531,860 | B1 | 3/2003 | Zhou et al. |
| 6,535,066 | B1 | 3/2003 | Petsko |
| 6,597,925 | B1 | 7/2003 | Garcia et al. |
| 6,765,440 | B2 | 7/2004 | Chandrasekaran |
| 6,965,676 | B1 | 11/2005 | Alfred |
| 7,116,955 | B2 * | 10/2006 | Schaffer et al. .......... 455/234.1 |
| 7,183,856 | B2 * | 2/2007 | Miki et al. .................. 330/297 |
| 7,333,563 | B2 | 2/2008 | Chan et al. |
| 7,375,540 | B2 * | 5/2008 | Burns et al. ................. 324/763 |
| 7,787,566 | B2 | 8/2010 | Chan et al. |
| 2001/0026600 | A1 | 10/2001 | Mochizuki et al. |
| 2001/0048292 | A1 | 12/2001 | Wahl |
| 2002/0013157 | A1 | 1/2002 | Ichikawa |
| 2002/0080887 | A1 | 6/2002 | Jeong et al. |
| 2002/0159503 | A1 | 10/2002 | Ramachandran |
| 2003/0002452 | A1 | 1/2003 | Sahota |
| 2003/0036361 | A1 | 2/2003 | Kawai et al. |
| 2003/0060193 | A1 | 3/2003 | Kurita |
| 2003/0176202 | A1 | 9/2003 | Bartl et al. |
| 2004/0100921 | A1 | 5/2004 | Khan |
| 2004/0146013 | A1 | 7/2004 | Song et al. |
| 2004/0180686 | A1 * | 9/2004 | Nakayama .................. 455/522 |
| 2004/0251962 | A1 | 12/2004 | Rosnell et al. |
| 2005/0285681 | A1 | 12/2005 | Doherty et al. |
| 2006/0046658 | A1 | 3/2006 | Cruz et al. |
| 2006/0046666 | A1 * | 3/2006 | Hara et al. ............... 455/127.1 |
| 2007/0035285 | A1 | 2/2007 | Balakrishnan et al. |
| 2007/0139014 | A1 | 6/2007 | Girson et al. |
| 2007/0184791 | A1 | 8/2007 | Vinayak et al. |
| 2007/0258602 | A1 | 11/2007 | Vepsalainen et al. |
| 2007/0291718 | A1 | 12/2007 | Chan et al. |
| 2009/0074107 | A1 | 3/2009 | Chan et al. |

FOREIGN PATENT DOCUMENTS

| | | |
|---|---|---|
| CN | 1355967 | 6/2002 |
| CN | 1153388 | 6/2004 |
| CN | 1525658 A | 9/2004 |
| EP | 0 977 354 A1 | 2/2000 |
| EP | 1146636 | 10/2001 |
| JP | 1994069002 | 8/1994 |
| JP | 6252797 | 9/1994 |
| JP | 774551 | 3/1995 |
| JP | 2001237722 | 8/2001 |
| JP | 2001284998 | 10/2001 |
| JP | 2004500775 | 1/2004 |
| JP | 2004048797 | 2/2004 |
| JP | 2005244996 | 9/2005 |
| WO | 0077950 | 12/2000 |
| WO | 0233844 | 4/2002 |
| WO | 0260088 | 8/2002 |

OTHER PUBLICATIONS

International Search Report/Written Opinion for PCT application PCT/CA2007/001055.
International Search Report / Written Opinion for international patent application PCT/CA2007/001057, date of mailing Oct. 4, 2007.
Japanese Office Action dated Apr. 13, 2010, Japanese Patent Application No. 2008-525353.
Korean Office Action dated Feb. 22, 2010, Korean Patent Application No. 10-2008-7003154.
US 6,560,446, 10/2002, Ramachandran (withdrawn).
Larson et al. "Device and Circuit Approaches for Improved Wireless Communications Transmitters", Oct. 1, 1999, IEEE Personal Communications, IEEE Communications Society, University of California, San Diego, pp. 18-23.
Co-pending U.S. Appl. No. 11/763,068, "Control of Switcher Regulated Power Amplifier Modules", filed Jun. 14, 2007.
Co-pending U.S. Appl. No. 12/785,009, "Input Drive Control For Switcher Regulated Power Amplifier Modules", filed May 21, 2010.
Co-pending U.S. Appl. No. 12/784,971, "Control of Switcher Regulated Power Amplifier Modules", filed May 21, 2010.
Co-pending U.S. Appl. No. 12/784,932, "Method and Apparatus For Optimizing Transmitter Power Efficiency", filed May 21, 2010.
Co-pending U.S. Appl. No. 12/847,612, "Method and Apparatus For Improving Power Amplifier Efficiency In Wireless Communication Systems Having High Peak To Average Power Ratios", filed Jul. 30, 2010.
Co-pending U.S. Appl. No. 12/276,650, "Method and Apparatus For Optimizing Transmitter Power Efficiency", filed Nov. 24, 2008.
European Office Action dated Jul. 7, 2010, EP Application No. 07719971.9.
United States Office Action dated Aug. 2, 2010, U.S. Appl. No. 11/763,068.
United States Office Action dated Mar. 29, 2010, U.S. Appl. No. 12/276,650.
United States Office Action Response dated Jun. 28, 2010, U.S. Appl. No. 12/276,650.
United States Notice of Allowance dated Aug. 13, 2010, U.S. Appl. No. 12/276,650.
United States Office Action Response dated Sep. 27, 2010, U.S. Appl. No. 11/763,068.
Co-pending U.S. Appl. No. 12/842,126, "Method of Power Amplifier Switching Power Control Using Post Power Amplifier Power Detection", filed Jul. 23, 2010.
Chinese Office Action dated Jan. 8, 2010, Chinese Patent Application No. 200780000803.5.
Canadian Office Action dated Nov. 9, 2009, Canadian Patent Application No. 2,616,323.
United States Office Action, U.S. Appl. No. 12/847,612, dated Oct. 27, 2010.
United States Notice of Allowance, U.S. Appl. No. 11/763,068, dated Nov. 24, 2010.
Chinese Office Action, Chinese Patent Application No. 200780000803.5, dated Nov. 25, 2010.

* cited by examiner

INPUT DRIVE CONTROL FOR SWITCHER REGULATED POWER AMPLIFIER MODULES

REFERENCE TO RELATED APPLICATION

This application claims priority from U.S. Provisional Patent Application Ser. No. 60/813,340 filed on Jun. 14, 2006.

FIELD

Embodiments described herein relate generally to wireless communications devices and more particularly to improved operation with switch regulated power amplifier modules.

BACKGROUND

Handheld wireless communication devices are powered by one or more internal batteries. A major performance criterion for such devices is their battery life, and a large portion of battery power is consumed in a power amplification block of the device's transmitter. In many handheld wireless applications, a switched mode power supply, which provides the supply voltage to a power amplifier in the power amplification block, along with a switching regulator, is used to reduce overall power consumption. However, this requires careful control of the switched mode power supply to achieve optimal power savings. Many conventional designs use a fixed-step, or continuous control technique for controlling the switched mode power supply. However, the use of a switching regulator to reduce the supply voltage to the power amplifier, results in various difficulties in both factory calibration and device performance. For example, with these conventional switching control methods, there is a non-linearity in the control curve that results, which makes calibration and temperature compensation difficult.

BRIEF DESCRIPTION OF THE FIGURES

For a better understanding of the embodiments described herein, and to show more clearly how they may be carried into effect, reference will now be made, by way of example only, to the accompanying drawings in which.

DETAILED DESCRIPTION

Figure 1:
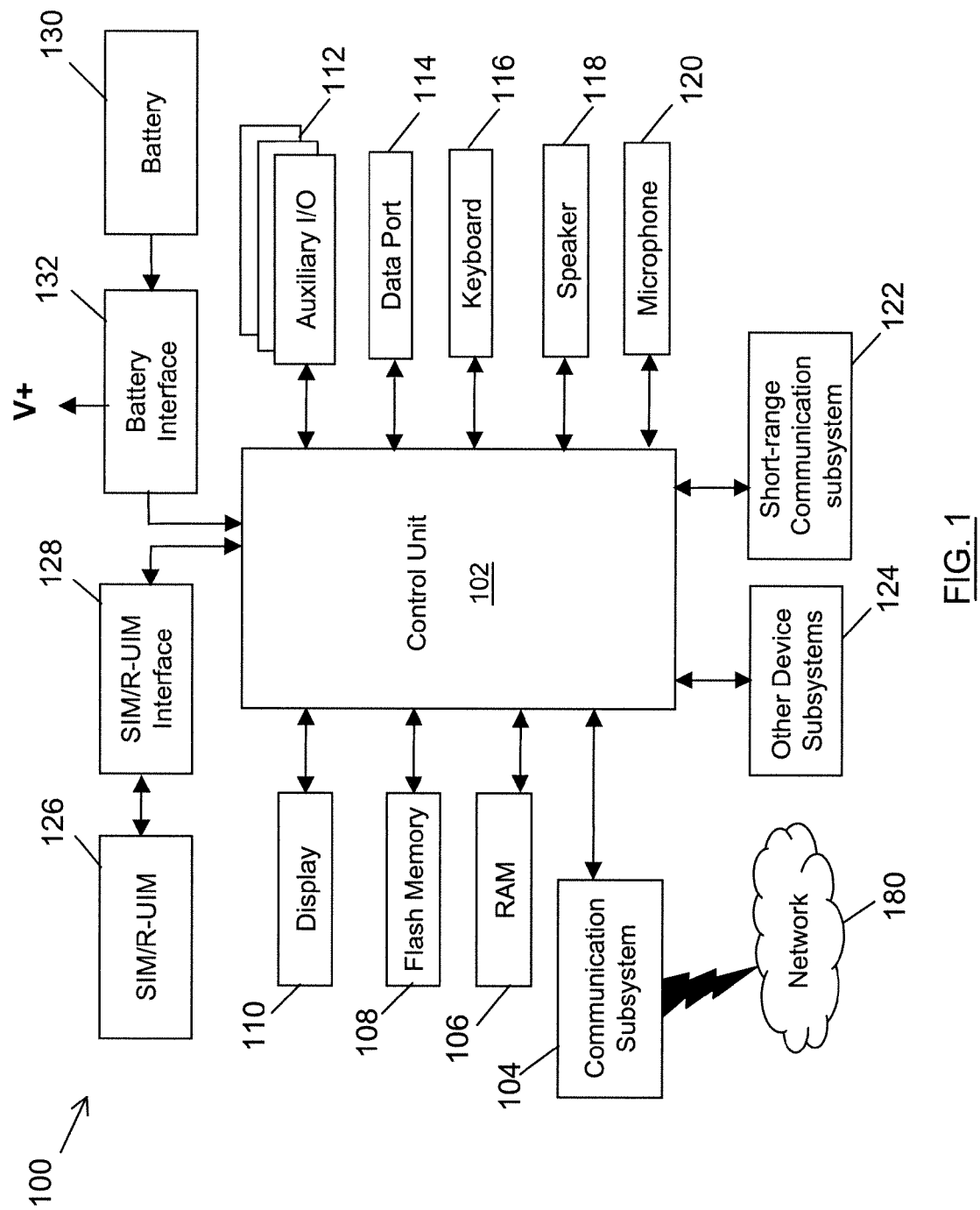
FIG. 1 is a block diagram of an exemplary embodiment of a wireless communications device.

It will be appreciated that for simplicity and clarity of illustration, where considered appropriate, reference numerals may be repeated among the figures to indicate corresponding or analogous elements. In addition, specific details may be included to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein, but rather as merely describing the implementation of the various embodiments described herein.

A wireless communications device is a two-way communications device with advanced data communication capabilities having the capability to communicate with other computer systems. The wireless communications device may also include the capability for voice communications. Depending on the functionality provided by the wireless communications device, it may be referred to as a data messaging device, a two-way pager, a cellular telephone with data messaging capabilities, a wireless Internet appliance, or a data communications device (with or without telephony capabilities). The wireless communications device communicates with other devices through a network of transceiver stations.

Referring first to FIG. 1, shown therein is a block diagram of an exemplary embodiment of a wireless communications device 100 which may also be referred to as a mobile communications device. The wireless communications device 100 comprises a number of components, such as a control unit 102 which controls the overall operation of the wireless communications device 100. The control unit 102 may be a microprocessor or a microcontroller. Any commercially available microcontroller, such as a microcontroller available from ARM, Motorola, Intel and the like may be used for the control unit 102.

Communication functions, including data and possibly voice communications, are performed through the communication subsystem 104. The communication subsystem 104 receives messages from and sends messages to a wireless network 180. In one embodiment, the communication subsystem 104 may be configured in accordance with CDMA2000 standards, or with Global System for Mobile Communication (GSM) and General Packet Radio Services (GPRS) standards. The GSM/GPRS wireless network is used worldwide and it is expected that these standards will eventually be superseded by the Enhanced Data GSM Environment (EDGE) and Universal Mobile Telecommunications Service (UMTS) standards. New standards are still being defined, but it is believed that they will have similarities to the network behaviour described herein, and it will also be understood that the device is intended to use any other suitable standards that are developed in the future. The wireless link connecting the communications subsystem 104 with the network 180 represents one or more different Radio Frequency (RF) channels, operating according to defined protocols specified for CDMA2000 or GSM/GPRS communications. With the network protocols, these channels are capable of supporting both circuit switched voice communications and packet switched data communications.

The control unit 102 also interacts with additional subsystems such as a Random Access Memory (RAM) 106, a flash memory 108, a display 110, an auxiliary input/output (I/O) subsystem 112, a data port 114, a keyboard 116, a speaker 118, a microphone 120, a short-range communications subsystem 122 and other device subsystems 124. Some of these components may be optional depending on the particular type of wireless communications device. Other types of non-volatile storage devices known in the art may be used rather than the flash memory 108. The keyboard 116 may be a telephone-type keypad, an alphanumeric keyboard or some other suitable keypad.

Some of the subsystems of the wireless communications device 100 perform communication-related functions, whereas other subsystems may provide "resident" or on-device functions. By way of example, the display 110 and the keyboard 116 may be used for both communication-related functions, such as entering a text message for transmission over the network 180, and device-resident functions such as a calculator or task list. Operating system software, and other various algorithms, used by the control unit 102 is typically stored in a persistent store such as the flash memory 108, which may alternatively be a read-only memory (ROM) or similar storage element (not shown). Those skilled in the art will appreciate that the operating system, specific device applications, or parts thereof, may be temporarily loaded into a volatile store such as the RAM 106.

The wireless communications device 100 may send and receive communication signals over the network 180 after required network registration or activation procedures have been completed. Network access is associated with a subscriber or user of the wireless communications device 100. To identify a subscriber, the wireless communications device 100 requires a Subscriber Identity Module or "SIM" card 126 or an R-UIM (Removable User Identity Module) to be inserted in a SIM interface 128 (or an R-UIM interface) in order to communicate with the network 180. The SIM card or R-UIM 126 is one type of a conventional "smart card" that is used to identify a subscriber of the wireless communications device 100 and to personalize the wireless communications device 100, among other things. Alternatively, user identification information can also be programmed into flash memory 108. Services may include: web browsing and messaging such as email, voice mail, Short Message Service (SMS), and Multimedia Messaging Services (MMS). More advanced services may include: point of sale, field service and sales force automation.

The wireless communications device 100 is a battery-powered device and includes a battery interface 132 for receiving one or more rechargeable batteries 130. The battery interface 132 is coupled to a regulator (not shown) which assists the battery 130 in providing supply power V+ to the wireless communications device 100. Although current technology makes use of a battery, future power source technologies such as micro fuel cells may provide the power to the wireless communications device 100.

The control unit 102, in addition to its operating system functions, enables execution of software applications on the wireless communications device 100. A set of applications which control basic device operations, including data and voice communication applications will normally be installed on the wireless communications device 100 during its manufacture. Another application that may be loaded onto the wireless communications device 100 may be a personal information manager (PIM). A PIM has the ability to organize and manage data items of interest to a subscriber, such as, but not limited to, e-mail, calendar events, voice mails, appointments, and task items. A PIM application has the ability to send and receive data items via the wireless network 180. In one embodiment, PIM data items are seamlessly integrated, synchronized, and updated via the wireless network 180 with the wireless communications device subscriber's corresponding data items stored and/or associated with a host computer system. This functionality creates a mirrored host computer on the wireless communications device 100 with respect to such items. This is especially advantageous where the host computer system is the wireless communications device subscriber's office computer system.

Additional applications may also be loaded onto the wireless communications device 100 through the network 180, the auxiliary I/O subsystem 112, the data port 114, the short-range communication subsystem 122, or any other suitable device subsystem 124. This flexibility in application installation increases the functionality of the wireless communications device 100 and may provide enhanced on-device functions, communication-related functions, or both. For example, secure communication applications may enable electronic commerce functions and other such financial transactions to be performed using the wireless communications device 100.

The data port 114 enables a subscriber to set preferences through an external device or software application and extends the capabilities of the mobile device 100 by providing for information or software downloads to the mobile device 100 other than through a wireless communication network. The alternate download path may, for example, be used to load an encryption key onto the mobile device 100 through a direct and thus reliable and trusted connection to provide secure device communication.

The short-range communication subsystem 122 provides for communication between the wireless communications device 100 and different systems or devices, without the use of the network 180. For example, the subsystem 122 may include an infrared device and associated circuits and components for short-range communication. Examples of short-range communication may include standards developed by the Infrared Data Association (IrDA), Bluetooth, and the 802.11 family of standards developed by IEEE.

In use, a received signal such as a text message, an e-mail message, or web page download will be processed by the communications subsystem 104 and input to the control unit 102. The control unit 102 will then process the received signal for output to the display 110 or alternatively to the auxiliary I/O subsystem 112. A subscriber may also compose data items, such as e-mail messages, for example, using the keyboard 116 in conjunction with display 110 and possibly auxiliary I/O subsystem 112. The auxiliary subsystem 112 may include devices such as: a touch screen, mouse, track ball, infrared fingerprint detector, or a roller wheel with dynamic button pressing capability. The keyboard 116 may be an alphanumeric keyboard and/or telephone-type keypad. A composed item may be transmitted over the network 180 through the communication subsystem 104.

For voice communications, the overall operation of the wireless communications device 100 is substantially similar, except that most of the received signals are output to the speaker 118, and most of the signals for transmission are transduced by microphone 120. Alternative voice or audio I/O subsystems, such as a voice message recording subsystem, may also be implemented on the wireless communications device 100. Although voice or audio signal output is accomplished primarily through the speaker 118, the display 110 may also be used to provide additional information such as the identity of a calling party, duration of a voice call, or other voice call related information.

Figure 2:
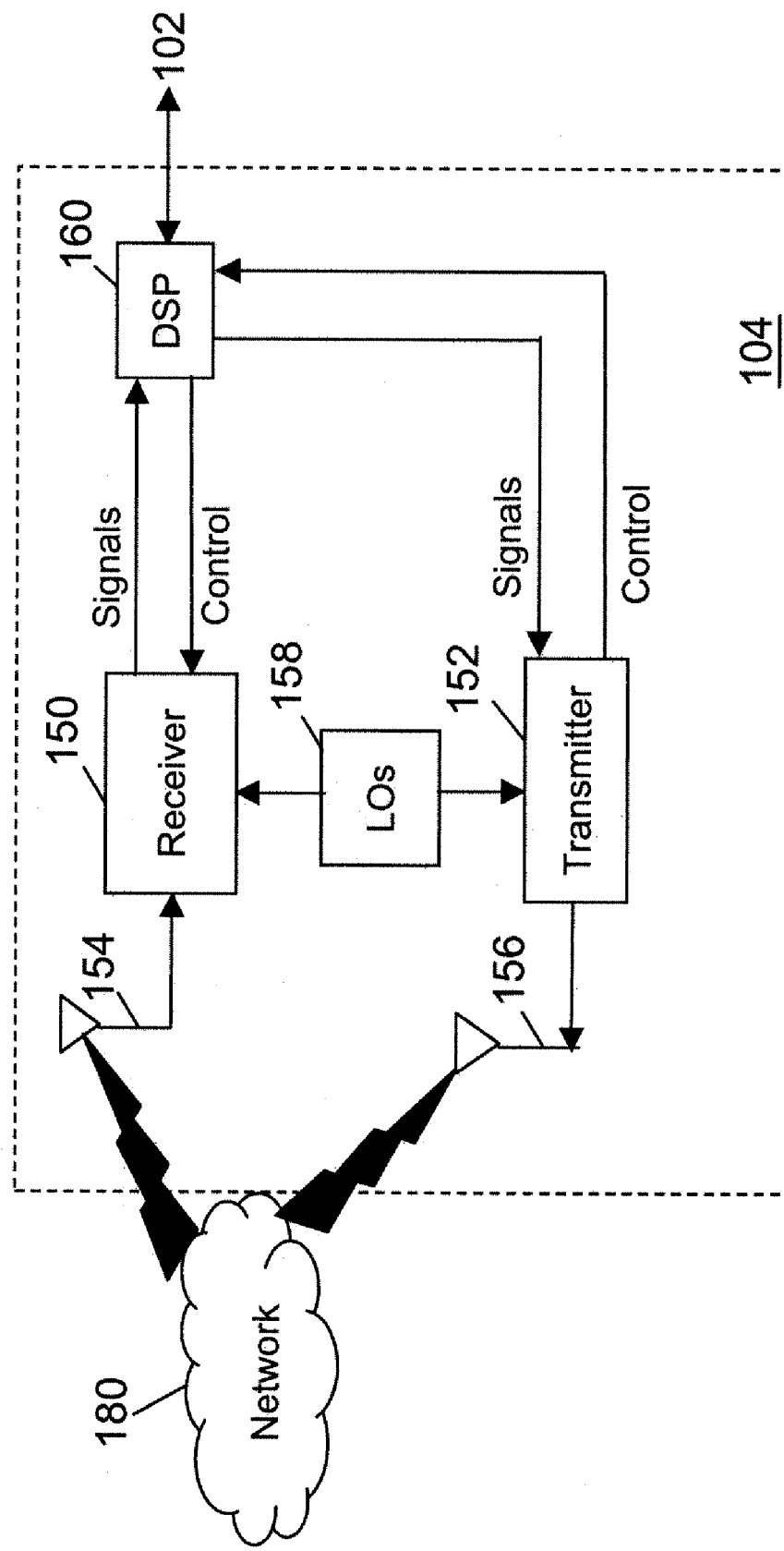
FIG. 2 is a block diagram of an exemplary embodiment of a communication subsystem component of the mobile device of FIG. 1.

Referring now to FIG. 2, a block diagram of the communication subsystem component 104 of FIG. 1 is shown. The communication subsystem 104 comprises a receiver 150, a transmitter 152, one or more embedded or internal antenna elements 154, 156, Local Oscillators (LOs) 158, and a processing module such as a Digital Signal Processor (DSP) 160.

The particular design of the communication subsystem 104 is dependent upon the network 180 in which the mobile device 100 is intended to operate, thus it should be understood that the design illustrated in FIG. 2 serves only as one example. Signals received by the antenna 154 through the network 180 are input to the receiver 150, which may perform such common receiver functions as signal amplification, frequency down conversion, filtering, channel selection, and analog-to-digital (A/D) conversion. A/D conversion of a received signal allows more complex communication functions such as demodulation and decoding to be performed in the DSP 160. In a similar manner, signals to be transmitted are processed, including modulation and encoding, by the DSP 160. These DSP-processed signals are input to the transmitter 152 for digital-to-analog (D/A) conversion, frequency up conversion, filtering, amplification and transmission over the network 180 via the antenna 156. The DSP 160 not only processes communication signals, but also provides for receiver and transmitter control. For example, the gains applied to communication signals in the receiver 150 and transmitter 180 may be adaptively controlled through automatic gain control algorithms implemented in the DSP 160.

The wireless link between the mobile device 100 and the network 180 may contain one or more different channels, typically different RF channels, and associated protocols used between the mobile device 100 and the network 180. An RF channel is a limited resource that must be conserved, typically due to limits in overall bandwidth and limited battery power of the mobile device 100.

When the mobile device 100 is fully operational, the transmitter 152 is typically keyed or turned on only when it is sending to the network 180 and is otherwise turned off to conserve resources. Similarly, the receiver 150 is periodically turned off to conserve power until it is needed to receive signals or information (if at all) during designated time periods.

The various embodiments described herein relate to a power management block that can be used in the transmitter 152 of the communication subsystem 104. The power management block provides improved control for the gain control signal provided to a pre-amplifier and the supply voltage provided to a power amplifier. The pre-amplifier and the power amplifier are both in a power amplification block of the transmitter 152. The power expended by the power amplifier is optimized by employing a continuous control scheme in which at least one feedback loop is employed to take into account various characteristics of certain components of the transmitter including the pre-amplifier and the power amplifier as well as various control signals in order to modify the AGC control of the preamplifier to linearize the relationship between the power of the amplified transmission signal and the AGC gain control signal that is provided to the amplification block.

Figure 3:
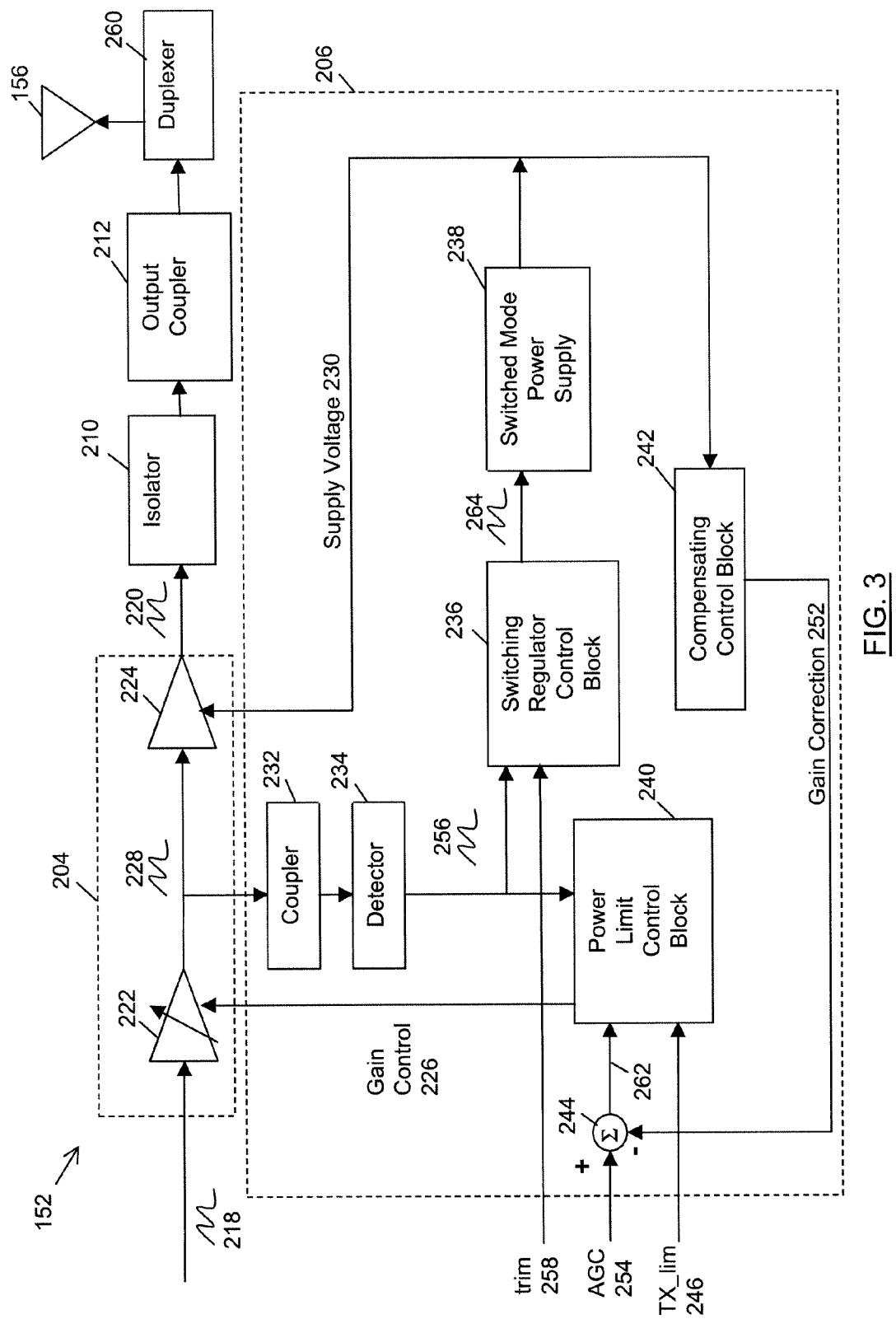
FIG. 3 is a block diagram of an exemplary embodiment of a portion of the transmitter of FIG. 2 having a power management block and an amplification block.

Referring now to FIG. 3, shown therein is a block diagram of an exemplary embodiment of a portion of the transmitter 152 that can be used in the communications subsystem 104 of the wireless communications device 100. The transmitter 152 includes a power amplification block 204, a power management block 206, an optional isolator 210 and an optional output coupler 212. The output coupler 212 is connected to the antenna 156 via a duplexer 260. The duplexer 260 is also connected to the receiver 150 (not shown). In some cases, the output coupler 212 can be connected to the detector 234 for power limiting. Structures that are suitable for the antenna 156, the isolator 210, the output coupler 212 and the duplexer 260 are commonly known to those skilled in the art and will not be described further.

The wireless communications device 100 generates a data signal that is to be transmitted using the transmitter 152. The data signal is typically a comparatively low frequency signal that is generally referred to as a baseband signal. The baseband signal is processed by various components (not shown but commonly known to those skilled in the art) of the communication subsystem 104 and mixed with a carrier signal having a substantially higher frequency to produce a transmission signal 218. The transmission signal 218 is amplified by the power amplification block 204 to produce an amplified transmission signal 220 for wireless transmission. The amplified transmission signal 220 is then sent through the isolator 210, the output coupler 212, and the duplexer 260 to be radiated by the antenna 156. The isolator 210 protects the power amplification block 204 from reflections or other signal energy that comes from the downstream components (i.e. the antenna 156). The amplified transmission signal 220 is sufficiently amplified so that it is received with little or no data loss at a remote base station or another communication device.

The power amplification block 204 includes a pre-amplifier 222 and a power amplifier 224. The pre-amplifier 222 is a variable gain amplifier and typically has a broad power range. The pre-amplifier 222 produces a pre-amplified transmission signal 228. The gain of the pre-amplifier 222 is varied to provide a first amount of gain depending on the desired power level for the amplified transmission signal 220. The gain of the pre-amplifier 222 is dictated by a gain control signal 226 provided by the power limit control block 240. The power amplifier 224 then amplifies the pre-amplified transmission signal 228 to provide the remainder of the required gain. The power amplifier 224 can provide a substantial gain, but typically has a smaller power gain than the pre-amplifier 222. It will be understood to a person skilled in the art that the power amplifier 224 may include one or multiple amplification stages.

A filter (not shown) may optionally be added after the pre-amplifier 222 for removing noise that is introduced into the pre-amplified transmission signal 228 by the pre-amplifier 222 and prior stages of the wireless communications device 100. The specific characteristics of the filter, such as the passband frequency range or the filter order, will depend on the noise that is to be filtered. Those skilled in the art will be capable of selecting appropriate parameters for the filter.

The power amplification block 204 is controlled by the power management block 206. The power management block 206 includes a coupler 232, a detector 234, a switching regulator control block 236, a switched mode power supply 238, a power limit control block 240, a compensating control block 242 and a summer 244. The power management block 206 can be divided into three subcomponents: a power supply block also known as a switching regulator control loop, a compensating feedback loop and a power limiting feedback loop. The switching regulator control loop includes the coupler 232, the detector 234, the switching regulator control block 236, and the switched mode power supply 238. The compensating feedback loop includes the components of the switching regulator control loop as well as the compensating control block 242, and the summer 244 and receives inputs from the AGC signal 254 and the TX_lim control signal 246. The power limiting feedback loop includes the coupler 232, the detector 234, and the power limit control block 240 and receives inputs from the output of the summer 244 and the TX_lim control signal 246.

It should also be noted that the power limit control block 240, the compensating control block 242, the summer 244 and the TX_lim control signal 246 are optional in some embodiments. In these embodiments, the AGC signal 254 is provided as the gain control signal 226 to the pre-amplifier 222. Furthermore, depending on the particular application, the power limit control loop and the compensating loop can be used separately. These loops are discussed in further detail below.

At any point during operation, the power amplifier 224 requires a supply voltage signal 230 with a magnitude that is sufficient so that the amplified transmission signal 220 can be produced with at most a maximum level of acceptable distortion. If the power amplifier 224 is always operating with the same level of acceptable distortion, then a fixed correction of the corresponding baseband data can be done to counteract the distortion while saving power. Accordingly, when the amplified transmission signal 220 is at any power within the transmitter's dynamic range, the power amplifier 224 should have constant headroom to ensure that the amplified transmission signal 220 is at most, always distorted in the same fashion.

One reason for significant power loss in the power amplification block 204 is that the amplified transmission signal 220 is rarely at the maximum level mentioned above and is usually at a much lower power level. The excess headroom between the supply voltage signal 230 provided to the power amplifier 224 and the magnitude of the amplified transmission signal 220 is dissipated as heat. To avoid this power loss, the switched mode power supply 238 is controlled by the switching regulator control block 236 to provide the supply voltage signal 230 with a certain magnitude such that there is a small, yet sufficient, amount of headroom to produce the amplified transmission signal 220 with acceptable distortion. The switching regulator control block 236 and the switched mode power supply 238 comprise the power supply block.

A trim signal 258 is a control signal that is provided to the power management block 206 by the control unit 102. The trim signal 258 is used to remove unit-to-unit variation during factory calibration of the wireless communications device 100. The variation is due to offsets caused by part variation for the components used to build the transmitter 152 and the feedback/control loops. The trim signal 258 trims or reduces variations caused by these offsets/tolerances. This can be done by sampling the output of the switched mode power supply 238 during operation and adjusting the value for the trim signal 258 to obtain acceptable performance. In addition, the compression artifacts of the transmitter 152 can be measured and the value of the trim signal 258 adjusted until the desired amount of distortion is observed. The trim signal 258 can be optional in some designs depending on the tolerance stackup.

The detector 234 senses the pre-amplified transmission signal 228, which is the input drive for the power amplifier 224, via the coupler 232. The detector 234 then produces a detected pre-amp output signal 256. In some implementations, the detector 234 can be an approximation to a true RMS detector with a linear scaled output. However, detectors having other forms of output, including a log output, may also be utilized. Furthermore, non-RMS detectors can also be used. The location of the detector 234 results in loop stability and power savings by not coupling with the output of the power amplifier 224 to sense the amplified transmission signal 220. Gain expansion of the power amplifier 224 would result in a control system with right hand poles, if the detector 234 is placed where it can be influenced by the gain expansion (i.e. on the output side of the power amplifier 224). With the detector 234 at the output of the power amplifier 224, an increase in power, caused by gain expansion or maybe noise, for example, would cause the detected output to increase and drive up the supply voltage signal 230. The resulting gain expansion would further increase the detected power. The process would then escalate. This is avoided by placing the detector 234 at the output of the pre-amplifier 222.

A person skilled in the art can select the appropriate coupler 232 to use with the detector 234. This selection process will be based on parameters such as the type of power amplifier 224, tuning of the various control blocks in the power management block 206, and intended overall performance targets for the power management block 206. A directional coupler can be used for the coupler 232, but a resistive tap may also be used if the pre-amplifier 222 has sufficient reverse isolation.

The detected pre-amp output signal 256 and the trim signal 258 are provided to the power management block 206 to limit the output power of the power amplification block 204. This is done by using these signals, as well as other information discussed below, to perform at least one of adjusting the gain of the pre-amplifier 222 and controlling the switched mode power supply 238 to provide the supply voltage signal 230 at a certain level. It should be noted that the main source of variation in the transmitter design is not due to the thermal characteristics of the power amplifier 224 but rather the variations in the thermal and frequency characteristics of the pre-amplifier 222, which are poor. Consequently, by detecting the output power of the pre-amplifier 222, most of the variation in the transmitter 152 can be removed while decreasing the power losses in the transmitter 152.

The switching regulator control block 236 controls the switched mode power supply 238 with a power supply control signal 264, which may be a continuous signal, a pulse width modulated signal or a pulse density modulated signal. The switched mode power supply 238 is controlled to provide the supply voltage signal 230 in an optimal fashion based on the trim signal 258 and the detected pre-amp output signal 256. The supply voltage signal 230 is the source of power for the power amplifier 224. In addition, in some implementations, it may be desirable to use a filter at the output of the switched mode power supply 238 to filter certain high frequency noise components from the supply voltage signal 230.

The switching regulator control block 236 utilizes a control device to provide the control voltage to the switched mode power supply 238 to output the correct magnitude for the supply voltage signal 230. Various control devices are associated with different switched mode power supplies to control their output, and one skilled in the art would know how to implement block 236 with the appropriate control device. The switched mode power supply 238 may be a DC-DC switch converter. However, a broad class of devices may be utilized as the switched mode power supply 238 as long as the output voltage, current, efficiency and noise requirements of the power amplification block 204 are met.

In some embodiments, the switching regulator control block 236 can use a switching control transfer function to generate the power supply control signal 264. In this case, the switching control transfer function can be generated by looking at several different output power levels for the power amplifier 224, and decreasing the supply voltage signal for of these levels until an acceptable minimum level of headroom is obtained for each power level. This provides a first relationship between the power level of the power amplifier 224 and the level of the supply voltage signal 230. These different power levels are then related to the level of input drive (i.e. the output of the detector 234) while the supply voltage signal 230 is held at the minimum level just discovered for each power level to obtain a relationship between the level of input drive and the power level of the power amplifier 224. These two relations are then combined to define the switching control transfer function between the output of the detector 234 and the output of the switched mode power supply 238.

The step response of the switching control transfer function can then be observed, either through modeling or actual testing, and certain parameters of the transfer function are adjusted to obtain acceptable timing according to the requirements of the transmitter 152. The steps to perform this are: 1) measure the step response of the system, 2) analyze the shape of the response to determine the compensation needed for the transfer function in order to meet timing requirements, 3) apply the compensation and test the system, and 4) go back to step one if necessary and repeat until the performance is satisfactory. This process is fairly iterative as one sometimes finds some undesired side effects during testing. The switching control transfer function can then be defined at this point by looking at the step response of the power management and amplification blocks 206 and 204 and generating the appropriate inverse.

The switching control transfer function can be realized with hardware by using a filter with a linear, first-order low pass function and an offset. The filter is offset a bit to compensate for the response of the switcher/other circuits which don't operate properly at 0 volts. Implementation as a filter can be done by taking the desired time response of the switching control transfer function, applying the Laplace transform to it, then synthesizing the filter based on the poles and zeros that are generated. However, the switching control transfer function can also be realized with software by using a look-up table.

Using a continuous control scheme for the switching regulator control block 236 and the switched mode power supply 238 to produce the supply voltage signal 230, without any additional information or feedback, tends to introduce a large non-linearity in the relationship between the automatic gain control (AGC) signal 254 and the power of the amplified transmission signal 220. This non-linearity is a result of the change in gain experienced by the power amplifier 224 when the magnitude of the supply voltage signal 230 changes (i.e. gain expansion as the bias conditions for the power amplifier 224 are changed). The input bias is usually internally generated by the power amplifier 224. It is possible to control the quiescent current of the power amplifier 224. Additional power savings can be obtained by trimming the quiescent current if desired. The non-linearity makes calibration and temperature compensation difficult.

Figure 4:
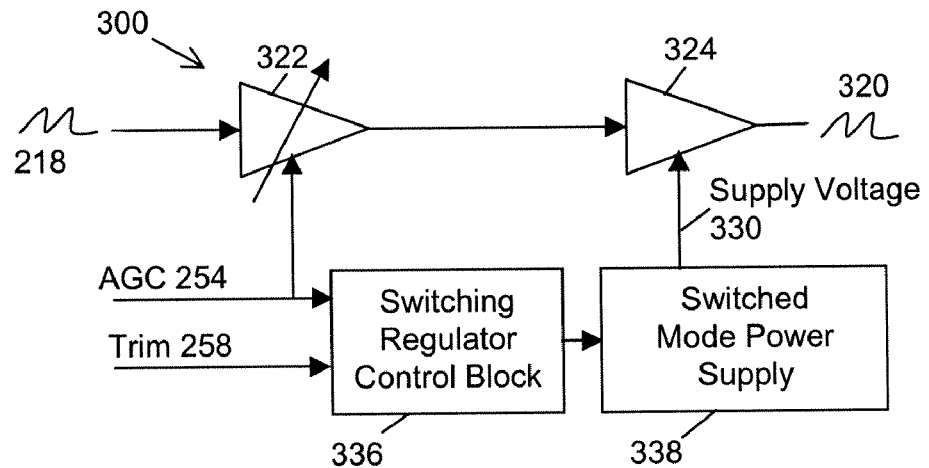
FIG. 4. is a block diagram of a portion of a conventional transmitter that employs a continuous control switcher regulator power management scheme.

Referring now to FIG. 4, shown therein is a block diagram of a portion of a conventional transmitter 300 that employs a continuous control switcher regulator power management scheme. The transmitter 300 includes a pre-amplifier 322, a power amplifier 324, a switching regulator control block 336 and a switched mode power supply 338. The transmitter receives the transmission signal 218 which is amplified by the pre-amplifier 322 and then by the power amplifier 324 to produce the amplified transmission signal 320. The gain of the pre-amplifier 322 is controlled by the AGC signal 254. The AGC signal 254 is also passed to the switching regulator control block 336 which uses this information to select the control the switched mode power supply 338 to produce required values for the supply voltage signal 330.

Figure 5:
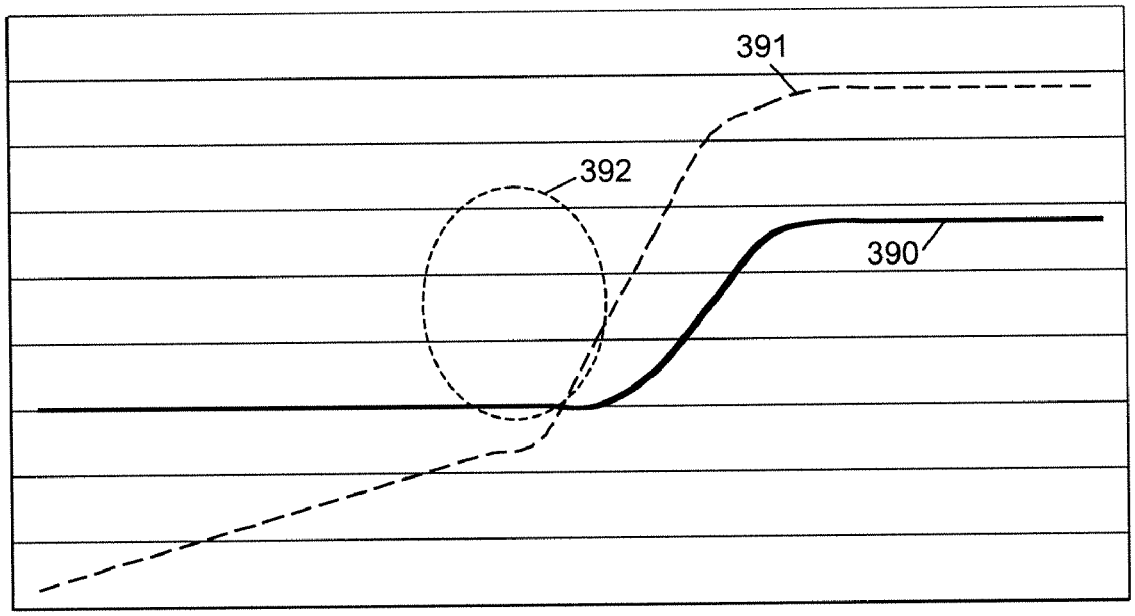
FIG. 5. is a graph of gain control signal versus variable power supply signal and amplified transmission signal power for the transmitter of FIG. 4.

Referring now to FIG. 5, shown therein is graph of a curve 390 of the AGC signal 254 versus the supply voltage signal 330, and a curve 391 of the AGC signal 254 versus the power of the amplified transmission signal 320 for the transmitter 300. Region 392 of the graph clearly shows the non-linearity between the AGC signal 254 and the supply voltage signal 330, and the power of the amplified transmission signal 320. This non-linearity makes it difficult to calibrate the transmitter 300. These curves are also called control curves. The nonlinearity is the result of the gain expansion experienced by the power amplifier 324 as its supply voltage is increased. Sometimes, the gain expansion can be minimized by maintaining a constant bias in the earlier stages of the power amplifier 324. However, doing so decreases power efficiency if no additional measures are taken. In the case of power amplifiers, which have a limited minimum supply voltage due to the bias circuitry structure, additional efficiency gains can be achieved by fixing the bias circuitry supply to a higher voltage and decreasing the final stage supply voltage below the previous limited minimum supply voltage.

As a result of these problems, some conventional designs use a second approach where the switching converter is step-controlled instead of continuously controlled. This leads to less optimal power savings and additional calibration steps since each state must be calibrated separately.

Figure 6:
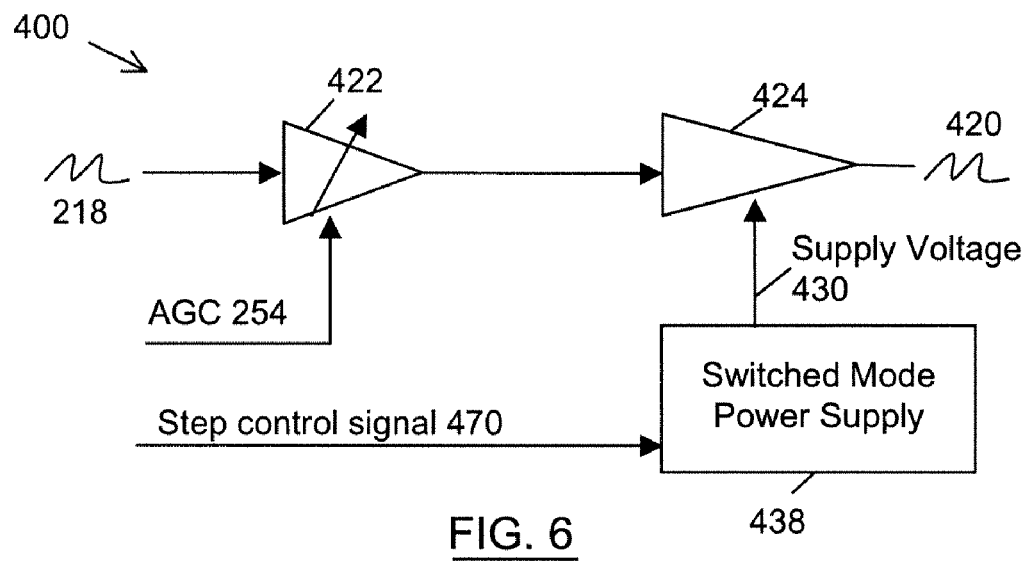
FIG. 6. is a block diagram of a portion of another conventional transmitter that employs a step control switcher regulator power management scheme.

Referring now to FIG. 6, shown therein is a block diagram of a portion of another conventional transmitter 400 that employs a step control switcher regulator power management scheme. The transmitter 400 includes a pre-amplifier 422, a power amplifier 424 and a switched mode power supply 438. The transmitter 400 is provided with the transmission signal 218 which is amplified by the pre-amplifier 422 and then by the power amplifier 424 to produce an amplified transmission signal 420. The gain of the pre-amplifier 422 is controlled by the AGC signal 254 provided by an associated processor. A step control signal 470 controls the switched mode power supply 438 to produce a supply voltage signal 430.

Figure 7:
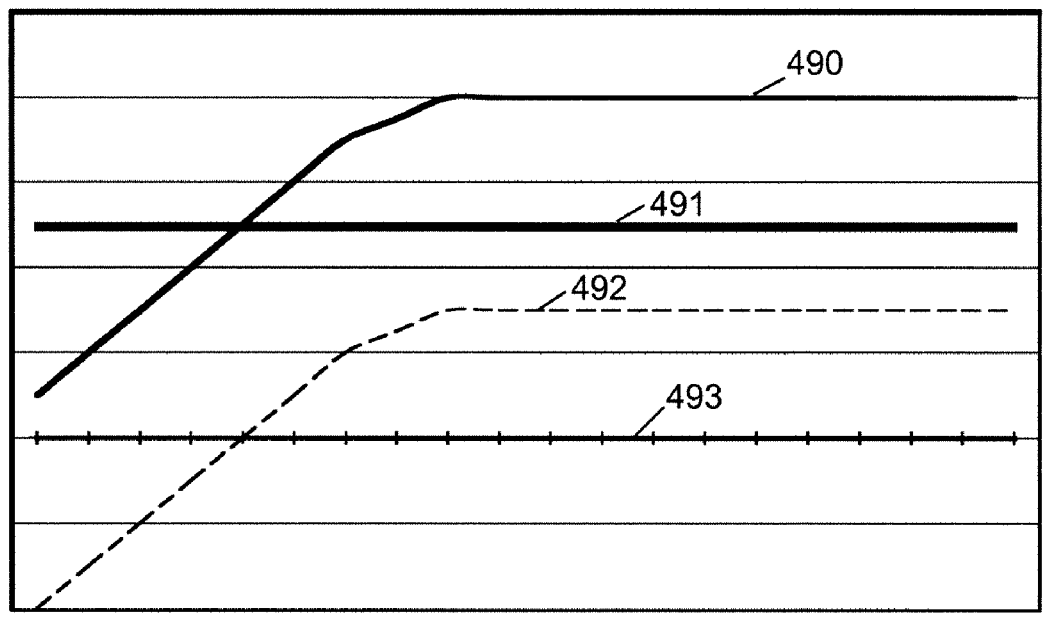
FIG. 7. is a graph of gain control signal versus variable power supply signal and amplified transmission signal power for the transmitter of FIG. 6.

Referring now to FIG. 7, shown therein is a graph of various curves of the AGC signal 254 versus the supply voltage signal 430 and the power of the amplified transmission signal 420 for the transmitter 400 for two different states of the step control switcher management scheme. Curve 490 represents the power of the amplified transmission signal 420 versus the AGC signal 254 during a first state. Curve 491 represents the supply voltage signal 430 versus the AGC signal 254 during the first state. Curve 492 represents the power of the amplified transmission signal 420 versus the AGC signal 254 during a second state. Curve 493 represents the supply voltage signal 430 versus the AGC signal 254 during a second state. While the relationship between the power of the amplified transmission signal 420 and the AGC signal 254 is linear up to a saturation point, calibration is still difficult because calibration must be done for each state separately.

Referring again to FIG. 3, the calibration difficulties come from the gain variation of the power amplifier 224 when the magnitude of the supply voltage signal 230 is changed. As the supply voltage signal 230 is increased, the gain of the power amplifier 224 also increases. In previous control schemes, the supply voltage signal 230 is controlled as a function of the AGC signal 254. As the AGC signal 254 increases, the gain of the power amplifier 224 increases predictably but the output increases much more rapidly at certain points in the curve. This is due to the combined effect of increased pre-driver gain and the gain change in the power amplifier 224 due to changes in the magnitude of the supply voltage signal 230. Accordingly, the kinks in the control curve can be eliminated by applying additional compensation to the AGC signal 254 before it reaches the pre-amplifier 222.

The topology shown of the power management block 206 in FIG. 3 is designed to address the deficiencies in the conventional switcher control schemes shown in FIGS. 4 to 7. The power management block 206 employs a compensating feedback loop to create a substantially linear relationship between the AGC signal 254 and the power of the amplified transmission signal 220. The compensating feedback loop includes the compensating control block 242 and the summer 244. The compensating control block 242 is an estimator that samples the supply voltage signal 230 at the output of switched mode power supply 238 and translates the supply voltage signal 230 into a gain correction signal 252. The gain correction signal 252 is then subtracted from the AGC signal 254 via the summer 244 to produce a modified gain control signal 262. The compensating feedback loop acts to null the ill effects introduced by varying the magnitude of the supply voltage signal 230 to the power amplifier 224.

A compensating transfer function can be used by the compensating control block 242 to translate a value for the supply voltage signal 230 to a value for the gain correction signal 252. First, the relationship between the gain and the supply voltage signal 230 for the power amplifier 224 is determined for several power amplifiers. Once an average relationship has been obtained it is inversed, taking into account some average characteristics of the pre-amplifier 222, such as the control slope of the pre-amplifier 222, to produce the compensating transfer function such that there is a linear relationship between the gain and the supply voltage signal 230. One characteristic to consider is the average gain versus control voltage curve for the pre-amplifier 222. The thermal characteristics can be compensated at top power by matching the characteristics of the detector and transmitter chain. Alternatively, another design, which uses brute force software compensation, may be used that has compensation for temperature at all power levels. Once the compensating transfer function is selected, the transient properties are examined by looking at the step response to make sure that it falls within acceptable limits. In designs which use the switching control transfer function, the compensating transfer function is selected and tuned after the switching control transfer function has been selected and tuned. In designs which also use the power limiting transfer function, which is discussed below, the parameters for the power limit control block 240 are set high to not have an effect on selecting and tuning the compensating transfer function.

The compensating transfer function may be implemented in software by a lookup table or in hardware using a hardware filter. When the compensating transfer function is realized via a lookup table, the supply voltage signal 230 and the rate of change of this signal is used to determine a value for the gain correction signal 252. The rate of change of the supply voltage signal 230 can be used to anticipate the state that the power amplifier 224 will be in next because it takes some time for the other circuits to adjust. In an alternative design, one could monitor the other bias parameters.

When the compensating transfer function is realized with a filter, the Laplace transform is applied to the time response or impulse response that corresponds to the compensating transfer function, and the filter is then synthesized based on the poles and zeros that are generated by the Laplace transform operation. The selection of the compensating transfer function allows for compensation not only of static gain changes but also dynamic variation due to lags in the control and power blocks. The compensating transfer function has a linear term and a first order derivative term.

Figure 8:
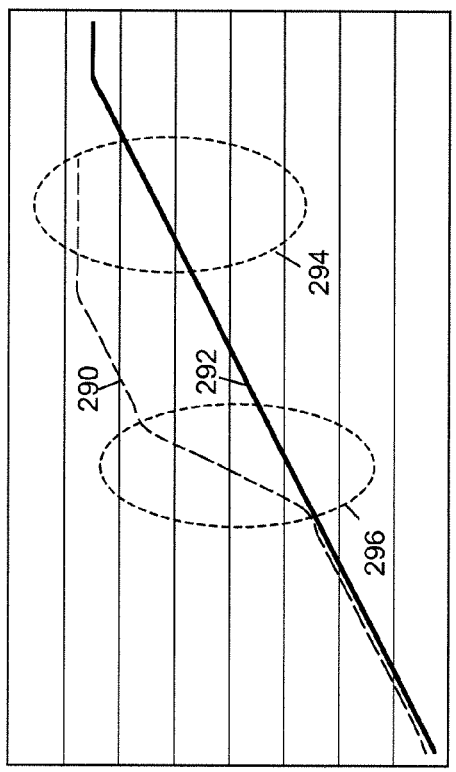
FIG. 8. is a graph of amplified transmission signal power versus the gain control signal for the transmitter of FIG. 3 with and without the compensating loop.

Referring now to FIG. 8, shown therein is a graph of the power of the amplified transmission signal versus the AGC signal 254 for the transmitter 152 with and without the compensating feedback loop. Curve 290 shows the power of the amplified transmission signal 220 as a function of the AGC signal 254 without the compensating feedback loop. Curve 292 shows the power of the amplified transmission signal 220 as a function of the AGC signal 254 with the compensating feedback loop. Region 296 highlights the fact that the compensation feedback loop removes the nonlinearity. Region 294 highlights the fact that the compensating feedback loop decreases or postpones the saturation effects.

The power limiting feedback loop of the power management block 206 is designed to anticipate and correct an overpower condition before it happens. The power limiting feedback loop includes the power limit control block 240, the coupler 232, the detector 234, and the summer 244. The gain control signal 226 is set by the power limit control block 240 based on various inputs. The AGC signal 254 and the TX_lim control signal 246 are provided by the control unit 102. Alternatively, these signals can be provided by a processor in the communication subsystem 104 if one exists. The TX_lim control signal 246 specifies the maximum allowable power of the output of the power amplifier 224. The TX_lim control signal 246 is a DC signal that is related to the operating frequency of the wireless communications device 100. When the operating frequency changes, the value of TX_lim control signal 246 changes in a corresponding fashion. The AGC signal 254 is modified by the output of the compensating control block 242. The detector 234 senses the magnitude of the pre-amplified transmission signal 228 and generates a corresponding detected pre-amp output signal 256 which is sent to the power limit control block 240. The power limit control block 240 monitors the detected pre-amp output signal 256 to determine when the magnitude of the pre-amplified transmission signal 228 exceeds the magnitude of the TX_lim control signal 246.

When the magnitude of the pre-amplified transmission signal 228 exceeds the transmission power limit, the power limit control block 240 adjusts the value of the modified AGC signal 262 to reduce the input drive to the power amplifier 224 by controlling the gain of the pre-amplifier 222. The effect of reduced input drive is a reduction in the power of the amplified transmission signal 220. The modified AGC signal 262 is already modified by the output of the compensating control block 242 to linearize the output power of the power amplification block 204 with respect to the gain control signal 226. Separating the power limiting function from the compensating control function also decreases the accuracy requirements of the compensating control block 242.

Figure 9:
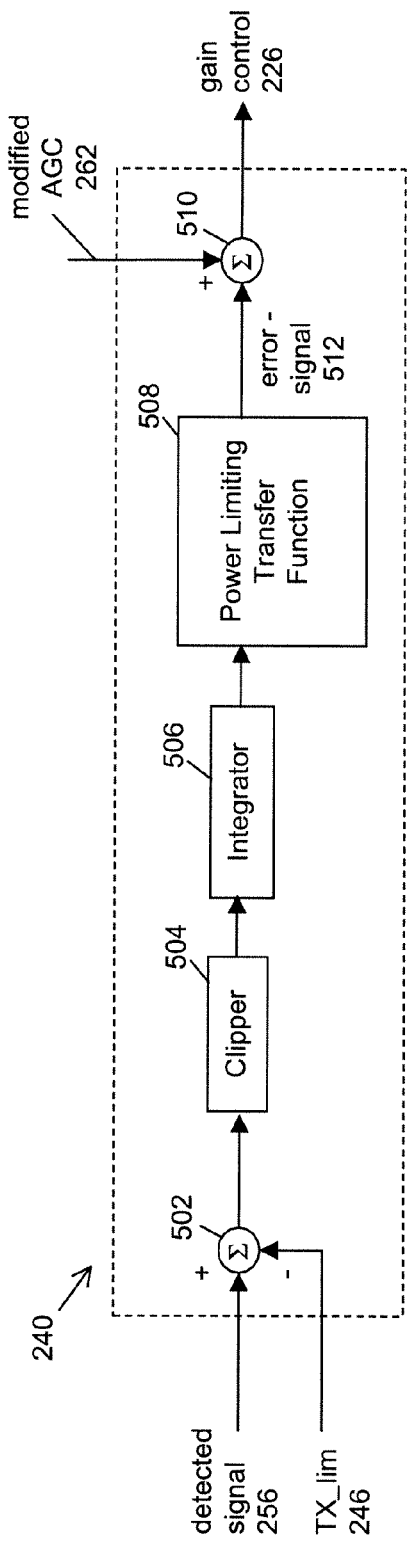
FIG. 9 is a block diagram of an exemplary embodiment of a power limit control block that can be used in the power management block of the transmitter of FIG. 3.

Referring now to FIG. 9, shown therein is a block diagram of an exemplary embodiment of the power limit control block 240. The power limit control block 240 includes a summer 502, a clipper 504, an integrator 506, a power limiting transfer function 508, and a second summer 510. The power limit control block 240 can anticipate an over power condition before it occurs and provides an appropriate value for the gain control signal 226 to prevent the over power condition from occurring. This is based on the selection of particular values for the power limiting transfer function 508, and by examining both the power error signal (i.e. the output of the summer 502) and the rate of change of the power error signal (i.e. the error signal 512) before generating a new value for the gain control signal 226. The rate of change of these signals is related to the rate of change of the output of the detector 234.

If there is a high rate of change, there is likely to be an overshoot in the output power and an over power condition will result.

The power error signal is obtained when the summer 502 subtracts the TX_lim control signal 246 from the detected pre-amp output signal 256. The power error signal is then passed sequentially through the clipper 504, the integrator 506, and the power limiting transfer function 508 to produce the error signal 512. The clipper 504 produces a clipped power error signal by converting all negative input values to zero, and passing positive values with an adjustment factor to account for the amount of correction deemed necessary to correct for the worst AGC error. Accordingly, the output of the clipper 504 is zero when the TX_lim control signal 246 has a larger amplitude than the detected pre-amp output signal 256. Further, the output value of the clipper 504 is equal to the amplitude difference between the detected pre-amp output signal 256 and the TX_lim control signal 246 multiplied by an adjustment factor when the magnitude of the detected pre-amp output signal 256 is larger than the magnitude of the TX_lim control signal 246. The adjustment factor is used for scaling purposes to compensate for the sensitivity of the various components that are used. Without the clipper 504, the power limit control block 240 would force the transmitter 152 to run at maximum power irrespective of the value of the AGC signal 254. The integrator 506 then integrates the clipped power error signal to provide an integrated power error signal (to achieve zero power residual error in the transmitted power when the power limit control block 240 settles). The integrator 506 can be implemented in hardware or software.

The power limiting transfer function 508 has a linear term and a first order derivative term. The power limiting transfer function 508 processes the integrated power error signal to detect an over power condition before it occurs. During rapid ramp-up of the output power of the power amplification block 204, the power control loop, including the switching regulator control block 236 and the switched mode power supply 238, may not respond quickly enough on its own. However, when a large rate of change of integrated error is detected, one can assume that the limit has been or will soon be exceeded and the output needs to be clamped extra quickly. This functionality is provided by various blocks in the power limit control block 240 including the power limiting transfer function 508. The power limit transfer function 508 is chosen to get the desired transient performance of the power limit control block 240 and can be selected based on prior knowledge of the different shaped power ramps to the control of the transmission power limit. The term "power ramp" refers to the relationship between power and time that is used to transition between different power levels. The knowledge of the expected shape allows for a more accurate design of the power limiting transfer function.

When the power limit TX_lim is exceeded, the error signal 512 is subtracted from the modified AGC signal 262 by the summer 510 to produce the gain control signal 226 to control the gain of the pre-amplifier 222. Alternatively, if the power limit TX_lim is not exceeded, the error signal has a value of 0 and the gain control signal 226 is the modified AGC signal 262. The modified AGC signal 262 is generated by subtracting the output of the compensating control block 242 from the AGC signal 254.

The power limiting transfer function 508 can be generated by setting various values for the detected pre-amp output signal 256, thereby testing various levels of over power with respect to the value of the TX_lim control signal 246, and selecting values for the power limiting transfer function 508 such that the level of the error signal 512 is adjusted so that the gain control signal 226 results in an acceptable level of input drive provided by the output of the pre-amplifier 222. This sets the steady state characteristics of the power limiting transfer function 508. The transient characteristics of the power limiting transfer function 508 are then observed by looking at the step response of the power limiting transfer function 508. The values of the power limiting transfer function 508 are then adjusted so that the overshoot and the settling time of the step response are acceptable. In designs that include the switching control loop, the compensating loop, and the power limiting loop, the switching control transfer function and the compensating transfer function are selected and tuned first before tuning the power limiting transfer function 508.

It should be noted that accurate, data rate independent power limiting is provided by the choice of the detector 234 and the way that the power limit control block 240 is tuned. As the peak to average power ratio changes, the observed output of the detector 234 varies if it is not a true RMS detector. The accuracy of the power limiting transfer function 508 will depend on detecting true RMS power. Also, some detectors will have a log output. With a log output, the top part of the scale is more compressed so fine control of the output power involves comparing increasingly smaller voltage differences. With a linear true RMS detector, the measurement is data rate independent and the top end of the scale is expanded.

As with the compensating transfer function, the power limiting transfer function 508 can be implemented in hardware with a filter. Alternatively, these transfer functions may be implemented with software (i.e. as a look-up table). For the software implementation, the response time depends on the guaranteed latency of the software used to do the computations/lookups. On a processor with many applications running concurrently, this comes down to: 1) code efficiency, and 2) whether the operating system can ensure guaranteed latencies when executing real time code. For software implementations of the transfer function, the analysis is done using discrete time steps. In general, the timing of the components is adjusted to provide a best fit to the timing requirements that are stipulated by the standard and network providers. The value for one timing parameter may need to be traded off against the value for another timing parameter.

By placing the detector 234 after the pre-amplifier 222 and before the power amplifier 224, it is possible to eliminate the isolator 210 and output coupler 212. In contrast, if the detector 234 was placed at the output of the power amplifier 224, the isolator 210 and output coupler 212 would be required to prevent reflected power from being sensed by the detector 234. Further, there would be power losses in the amplified transmission signal 220 due to the sampling done by the detector 234 if it was placed at the output of the power amplifier 224.

The isolator 210 and output coupler 212 can be removed since the reverse isolation of the power amplifier 224 prevents reflected power from reaching the detector 234. The reverse isolation of the power amplifier 224 is indicated by the $S_{12}$ parameter which is the ratio of the power at the input of the power amplifier 224 to the power at the output of the power amplifier 224 when no input signal is provided to the power amplifier 224 and power is injected at the output of the power amplifier 224. A good reverse isolation can be achieved by controlling the drain gate capacitance of the final gain stage of the power amplifier 224 (for FET power amplifiers) or the collector base capacitance of the final gain stage of the power amplifier 224 (for HBT power amplifiers).

The removal of the isolator 210 and the output coupler 212 results in a cost savings due to implementing the transmitter 152 with a reduced number of components. In addition, the removal of the isolator 210 and output coupler 212 eliminates additional components where power may be diverted or dissipated between the power amplification block 204 and the antenna 156, which reduces the amount of power loss in the amplified transmission signal 220 before it reaches the antenna 156.

However, with removal of the isolator 210 and the output coupler 212, the power amplifier 224 must be matched to the duplexer 260 to prevent load-induced power changes (especially if the isolator 210 is removed) since the reflected power at the output of power amplifier 224 as a result of load shifts can cause the forward power to change by upsetting the operating point of the power amplifier 224. Also, the reflected power can sometimes disturb the input of the power amplifier 224 if the reverse isolation is poor. However, with good reverse isolation and matching to the duplexer 260, the isolator 210 and the output coupler 212 can be removed without incurring the usual maximum output power accuracy penalties.

It should be noted that the architecture of the power management block 206 along with the location of the detector 234 results in: 1) accurate, rate independent power limiting, and 2) linearization of the AGC curve versus transmission power for the power amplification block 204. Also, the continuous control method used by the switching regulator control block 236 results in: 1) better power savings, and 2) no phase discontinuities in the transmitted signal during a step change in the magnitude of the supply voltage signal 230.

Each transfer function is tuned in an appropriate manner related to its functionality and the transfer functions used in the various blocks are different from one another. Also, careful tuning of the loops is needed if the transmitter 152 is to be used in situations in which the output power may change rapidly, such as during an access probe or a gated transmission.

The architecture of the power management block 206, and the method used to obtain the transfer function for the compensating control block 242 helps decrease calibration time by removing non-linearities in the power vs. AGC response curve for the power amplification block 204 and the power management block 206. The compensating control block 242 and corresponding method also helps to improve top power calibration by delaying the onset of AGC curve saturation. Both of these results can be achieved without sacrificing power savings, and without introducing phase discontinuities as a function of operating power (which if it existed, would need to be characterized and calibrated out with baseband processing). The compensating control block 242 and corresponding method also allow for the use of slower DC-DC converters for the switched mode power supply 238, which results in efficiency gains without suffering the usual transient response penalties. The need for power can be anticipated based on the changing of the level of the supply voltage signal. Slower DC-DC converters can be used because their output can be changed ahead of time.

In one aspect, at least one embodiment described herein provides a transmitter for a wireless communications device. The transmitter comprises a power amplification block comprising: a pre-amplifier configured to amplify a transmission signal to produce a pre-amplified transmission signal; and a power amplifier coupled to the pre-amplifier and configured to amplify the pre-amplified transmission signal to produce an amplified transmission signal. The transmitter further comprises a power management block comprising: a power supply block configured to generate and provide a supply voltage signal and to the power amplifier; and a compensating control block configured to adjust an automatic gain control (AGC) signal for controlling pre-amplifier gain, the compensating control block being coupled to the output of the power supply block to generate a gain correction signal based on the supply voltage signal to modify the AGC signal.

In another aspect, at least one embodiment described herein provides a mobile communication device comprising a main processor configured to control the operation of the mobile communication device; a communication subsystem connected to the main processor, the communication subsystem being configured to send and receive data. The communication subsystem comprises a power amplification block comprising a pre-amplifier configured to amplify a transmission signal to produce a pre-amplified transmission signal; and a power amplifier coupled to the pre-amplifier and configured to amplify the pre-amplified transmission signal to produce an amplified transmission signal; and a power management block comprising a power supply block configured to generate and provide a supply voltage signal and to the power amplifier; and a compensating control block configured to adjust an automatic gain control (AGC) signal for controlling pre-amplifier gain, the compensating control block being coupled to the output of the power supply block to generate a gain correction signal based on the supply voltage signal to modify the AGC signal.

In yet another aspect, at least one embodiment described herein provides a method of controlling gain of a power amplification block of a transmitter, the power amplification block including a pre-amplifier and a power amplifier. The method comprises generating and providing a supply voltage signal and to the power amplifier; generate a gain correction signal based on the supply voltage signal; and modifying an automatic gain control (AGC) signal for controlling pre-amplifier gain based on the gain correction signal.

It should be understood that various modifications can be made to the embodiments described and illustrated herein, without departing from the embodiments, the general scope of which is defined in the appended claims.

The invention claimed is:

1. A transmitter for a wireless communications device, wherein the transmitter comprises:
   a power amplification block comprising:
      a pre-amplifier configured to amplify a transmission signal to produce a pre-amplified transmission signal; and
      a power amplifier coupled to an output of the pre-amplifier and configured to amplify the pre-amplified transmission signal to produce an amplified transmission signal;
   a detector coupled to the output of the pre-amplifier to sense the pre-amplified transmission signal and provide a detected pre-amp output signal; and
   a power management block comprising:
      a power supply block configured to generate a supply voltage signal based on the detected pre-amp output signal, and to provide the supply voltage signal to the power amplifier; and
      a compensating control block coupled to an output of the power supply block in a compensating feedback loop and configured to generate a gain correction signal based on the supply voltage signal, the gain correction signal for adjusting an automatic gain control (AGC) signal to produce a modified AGC signal for controlling pre-amplifier gain.

2. The transmitter of claim 1, wherein the compensating control block comprises a compensating transfer function adapted to produce the gain correction signal from the supply voltage signal and maintain a substantially linear relationship between the AGC signal and amplified transmission signal power and postpone saturation effects of the relationship.

3. The transmitter of claim 1, wherein the power management block further comprises a power limit control block configured to anticipate and correct an over-power condition by modifying the pre-amplifier gain.

4. The transmitter of claim 3, wherein the power limit control block is configured to provide a gain control signal to the pre-amplifier to limit the transmission power of the power amplification block, and wherein the gain control signal is based on the detected pre-amp output signal, a transmit power limit signal and the modified AGC signal.

5. The transmitter of claim 4, wherein the modified AGC signal is produced by subtracting the gain correction signal from the AGC signal.

6. The transmitter of claim 5, wherein the power limit control block comprises:
   a clipper configured to produce a clipped power error signal by converting negative values of a power error signal to zero and multiplying positive values of the power error signal by an adjustment factor, wherein the power error signal is produced by subtracting the transmit power limit signal from the detected pre-amp output signal;
   an integrator configured to integrate the clipped power error signal to produce an integrated power error signal; and
   a power limiting transfer function configured to process the integrated power error signal to detect the over-power condition before the over-power condition occurs and to generate an error signal,
wherein the gain control signal is generated by subtracting the error signal from the modified AGC signal.

7. The transmitter of claim 1, wherein the detector is one of a linear root mean square (RMS) detector or a non-RMS detector.

8. A mobile communication device comprising:
   a main processor configured to control the operation of the mobile communication device;
   a communication subsystem connected to the main processor, the communication subsystem being configured to send and receive data, the communication subsystem comprising:
   a power amplification block comprising a pre-amplifier configured to amplify a transmission signal to produce a pre-amplified transmission signal; and a power amplifier coupled to an output of the pre-amplifier and configured to amplify the pre-amplified transmission signal to produce an amplified transmission signal;
   a detector coupled to the output of the pre-amplifier to sense the pre-amplified transmission signal and provide a detected pre-amp output signal; and
   a power management block comprising a power supply block configured to generate a supply voltage signal based on the detected pre-amp output signal, and to provide the supply voltage signal to the power amplifier; and
   a compensating control block coupled to an output of the power supply block in a compensating feedback loop and configured to generate a gain correction signal based on the supply voltage signal, the gain correction signal for adjusting an automatic gain control (AGC) signal to produce a modified AGC signal for controlling pre-amplifier gain.

9. The mobile communication device of claim 8, wherein the compensating control block comprises a compensating transfer function adapted to produce the gain correction signal from the supply voltage signal and maintain a substantially linear relationship between the AGC signal and amplified transmission signal power and postpone saturation effects of the relationship.

10. The mobile communication device of claim 8, wherein the power management block further comprises a power limit control block configured to anticipate and correct an over-power condition by modifying the pre-amplifier gain.

11. The mobile communication device of claim 10, wherein the power limit control block is configured to provide a gain control signal to the pre-amplifier to limit the transmission power of the power amplification block, and wherein the gain control signal is based on the detected pre-amp output signal, a transmit power limit signal and the modified AGC signal.

12. The mobile communication device of claim 11, wherein the modified AGC signal is produced by subtracting the gain correction signal from the AGC signal.

13. The mobile communication device of claim 12, wherein the power limit control block comprises:
   a clipper configured to produce a clipped power error signal by converting negative values of a power error signal to zero and multiplying positive values of the power error signal by an adjustment factor, wherein the power error signal is produced by subtracting the transmit power limit signal from the detected pre-amp output signal;
   an integrator configured to integrate the clipped power error signal to produce an integrated power error signal; and
   a power limiting transfer function configured to process the integrated power error signal to detect the over-power condition before the over-power condition occurs and to generate an error signal,
wherein the gain control signal is generated by subtracting the error signal from the modified AGC signal.

14. The mobile communication device of claim 8, wherein the detector is one of a linear root mean square (RMS) detector or a non-RMS detector.

15. A method of controlling gain of a power amplification block of a transmitter, the power amplification block including a pre-amplifier and a power amplifier coupled to an output of the pre-amplifier, wherein the method comprises:
   sensing the output of the pre-amplifier to provide a detected pre-amp output signal;
   generating a supply voltage signal based on the detected pre-amp output signal and providing the supply voltage signal to the power amplifier;
   generating a gain correction signal based on the supply voltage signal; and
   adjusting an automatic gain control (AGC) signal based on the gain correction signal to produce a modified AGC signal for controlling pre-amplifier gain.

16. The method of claim 15, wherein the method further comprises using a compensating transfer function to produce the gain correction signal from the supply voltage signal and maintain a substantially linear relationship between the AGC signal and output power of the power amplifier and postpone saturation effects of the relationship.

17. The method of claim 15, wherein the method further comprises anticipating and correcting an over-power condition by modifying the pre-amplifier gain.

18. The method of claim 17, wherein the method further comprises providing a gain control signal to the pre-amplifier to limit the transmission power of the power amplification block, wherein the gain control signal is based on the detected pre-amp output signal, a transmit power limit signal and the modified AGC signal.

19. The method of claim 18, wherein the method further comprises producing the modified AGC signal by subtracting the gain correction signal from the AGC signal.

20. The method of claim 19, wherein the method further comprises:
- producing a power error signal by subtracting the transmit power limit signal from the detected pre-amp output signal;
- clipping the power error signal to produce a clipped power error signal by converting negative values of the power error signal to zero and multiplying positive values of the power error signal by an adjustment factor;
- integrating the clipped power error signal to produce an integrated power error signal;
- processing the integrated power error signal with a power limiting transfer function to detect the over-power condition before the over-power condition occurs and to generate an error signal; and
- generating the gain control signal by subtracting the error signal from the modified AGC signal.

21. The method of claim 15, wherein the method comprises using one of a linear root mean square (RMS) detector and or a non-RMS detector.

* * * * *